(12) United States Patent
Momtaz

(10) Patent No.: US 7,325,175 B2
(45) Date of Patent: Jan. 29, 2008

(54) PHASE ADJUST USING RELATIVE ERROR

(75) Inventor: Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 304 days.

(21) Appl. No.: 11/123,355

(22) Filed: May 4, 2005

(65) Prior Publication Data

US 2006/0253746 A1  Nov. 9, 2006

(51) Int. Cl.
*G06F 11/00* (2006.01)

(52) U.S. Cl. .......................................... 714/704; 327/9
(58) Field of Classification Search ................ 327/280, 327/12, 9; 375/371; 714/704; 341/120
See application file for complete search history.

(56) References Cited

U.S. PATENT DOCUMENTS

| | | | |
|---|---|---|---|
| 4,873,491 A * | 10/1989 | Wilkins | 327/280 |
| 5,294,926 A * | 3/1994 | Corcoran | 341/120 |
| 6,711,226 B1 * | 3/2004 | Williams et al. | 375/371 |
| 7,148,828 B2 * | 12/2006 | Fernandez et al. | 341/120 |
| 7,202,707 B2 * | 4/2007 | Momtaz | 327/12 |

* cited by examiner

*Primary Examiner*—David Ton

(57) ABSTRACT

A system may adjust the times at which data is sampled by separate sampling mechanisms. Here, it may be desirable to ensure that one sampler samples data at substantially the same time as the other sampler. For example, output data from a high speed sampler that samples received data may be compared with an output of an analog to digital converter that samples the received data at a lower data rate. This difference or relative error may be accumulated over a period of time for given values of delay applied to the clock for the analog to digital converter. In this way, a delay value that minimizes the relative error may be selected as a desired delay value.

44 Claims, 7 Drawing Sheets

PHASE ADJUST USING RELATIVE ERROR

TECHNICAL FIELD

This application relates to data communications and, more specifically, to a system and method for adjusting delay in a circuit in accordance with relative error measurements.

BACKGROUND

Conventional receivers for high speed serial communication systems may include a clock and data recovery circuit that extracts clock and data information from a received serial signal. For example, such a circuit may produce a clock signal synchronized with the incoming signal and the clock signal may then be used to recover data (e.g., data symbols) from the signal. Typically, the clock signal is generated at a frequency that matches the frequency of the data symbol rate in the received signal. The clock signal is then used to sample the received signal to recover individual data bits that correspond to each data symbol.

A clock and data recovery circuit may comprise a phase lock loop ("PLL") or a delay lock loop ("DLL") that aligns the edges, for example the rising edges, of a generated clock signal with the transition edges of the received signal (e.g., the edges of data symbols). As a result, the falling edges of the clock may be generated at times that coincide with approximately the middle of the data symbols. Thus, the falling edges of the clock signal may be used to sample the received signal in the middle of the data symbols.

In operation, however, bandwidth limitations inherent in the data communication media may tend to create increasing levels of data distortion as the data rate increases and as the channel length increases. For example, band-limited channels tend to spread transmitted pulses (e.g., as a result of micro-reflection in the channel). If the width of a spread pulse exceeds a symbol duration, overlap with neighboring pulses may occur. This condition is known as inter-symbol interference ("ISI"). In many applications, particularly high speed applications, relatively high levels of ISI may significantly degrade the performance of the receiver. Therefore, typical high speed receivers may include an adaptive equalizer (e.g., a decision feedback equalizer) that cancels or reduces ISI.

In some applications equalizer coefficients that control the adaptive equalization may be generated in accordance with data that is sampled from the received signal. For example, the received data may be equalized before it is sampled by, for example, a high speed retimer. To control the adaptive equalization, the equalized, but unsampled, data may be sampled by an analog to digital converter ("ADC"). The output of this analog to digital converter may then be used to generate coefficients for the adaptive equalizer using, for example, a least mean square adaptation algorithm.

In general, it may be desirable that the clock for the analog to digital converter be phase aligned with the clock for the retimer. Inaccuracy in the phase relationships may result in performance degradation of the receiver since the received signal may be equalized at a non-optimum point in time.

SUMMARY

A system and/or method of adjusting the phase of signals for a system, substantially as shown in and/or described in connection with at least one of the figures, as set forth more completely in the claims.

BRIEF DESCRIPTION OF THE DRAWINGS

These and other features, aspects and advantages of the present invention will be more fully understood when considered with respect to the following detailed description, appended claims and accompanying drawings, wherein:

Figure 1:
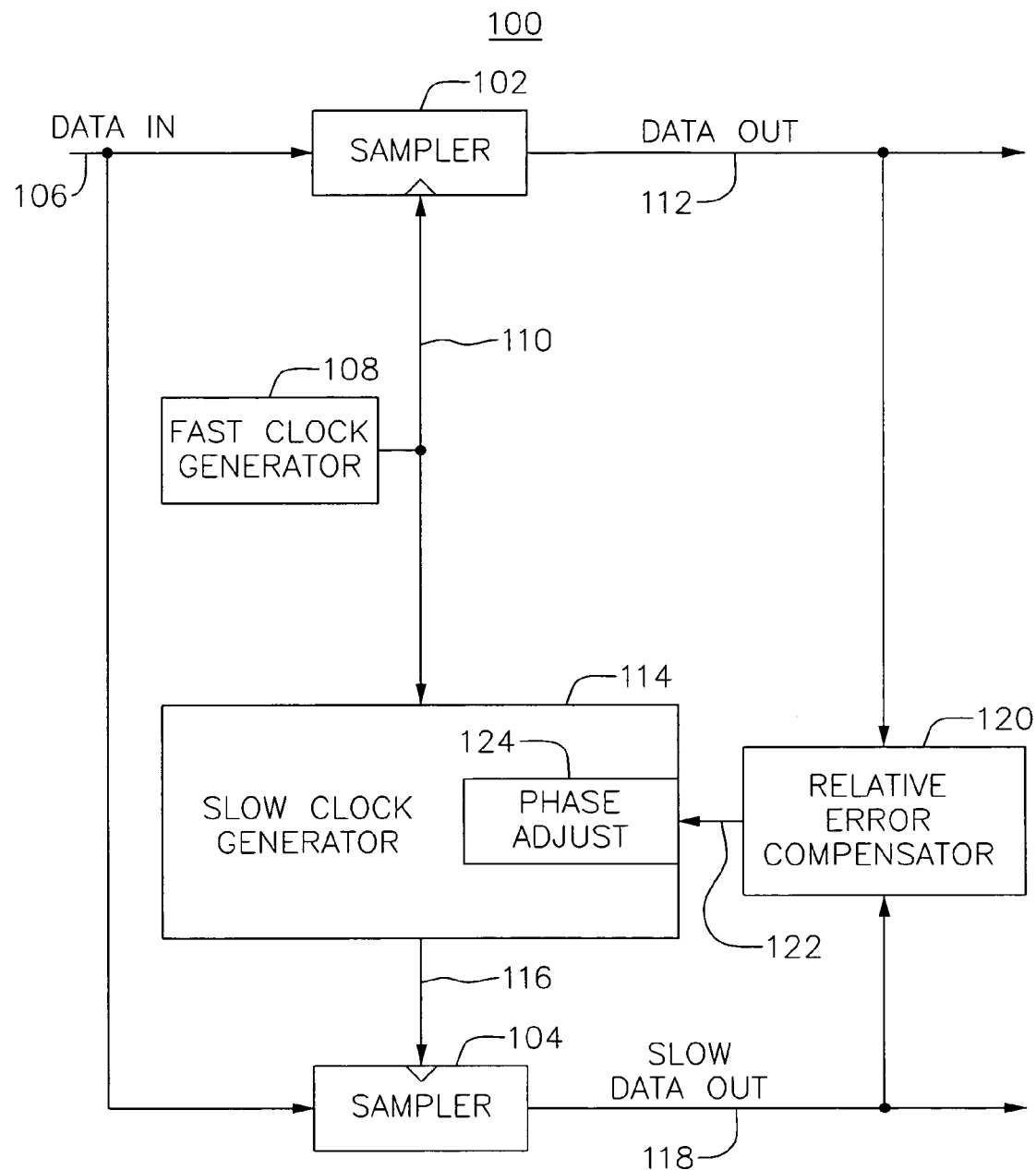
FIG. 1 is a simplified block diagram of one embodiment of a relative error circuit constructed in accordance with the invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention. For example, references to specific structures and processes in the disclosed embodiments should be understood to be but one example of structures and processes that may be used in these or other embodiments in accordance with the teachings provided herein. Accordingly, otherwise restrictive nomenclatures such as "is," "are," etc. should be understood to include less restrictive meanings such as "may be," etc. For convenience, an embodiment of a system constructed or a method practiced according to the invention may be referred to herein simply as an "embodiment."

FIG. 1 is a simplified block diagram of one embodiment of a relative error compensation system 100. In some embodiments the system 100 may be used to adjust the times at which data is sampled by separate sampling mechanisms (e.g., samplers 102 and 104). For example, it may be desirable to ensure that one sampler samples data at substantially the same time as the other sampler.

Applications that involve sampling data using more than one sampler may include, for example, a system that uses one sampler to recover data from a data stream and that uses another sampler to sample the data stream at a lower data rate to generate data that may be used to compensate the data stream. For example, in FIG. 1 an input data signal 106 is provided to the samplers 102 and 104. A fast clock generator 108 generates a fast clock signal 110. The sampler 102 is clocked by the fast clock signal 110 to generate an output data signal 112. A slow clock generator 114 generates a slow clock signal 116 from the fast clock signal 110. The sampler 104 is clocked by the slow clock signal 116 to generate an output data signal 118 that may be used to compensate the input data 106.

By aligning the clock signals 110 and 116, the system 100 may help to ensure that any compensation applied to, for example, the input data signal 106 is based on the condition of the input data signal 106 at the time it is sampled by the sampler 102. This alignment, in turn, may improve the performance of an associated system.

In some applications precise alignment of the edges of the clock signals 110 and 116 may not ensure that the moment in time that sampler 102 samples its input data (e.g., data 106) is the same moment in time that the sampler 104 samples its input data. For example, delays may exist in the circuit that result in the respective input data not arriving at each sampler at precisely the same point in time. Moreover, the samplers 102 and 104 may have different sample and hold times.

To help compensate for the above problem, the system 100 includes a relative error compensator 120 that compares the relative error between the sampled data signals 112 and 118. Based on this relative error measurement, the compensator 120 generates a signal 122 that controls a phase adjust circuit 124 in the clock generator 114. In some embodiments the compensator 120 is configured to adjust the signal 122, thereby adjusting the timing of the slow clock signal 116, so that the relative error between the two data signals 112 and 118 is minimized.

Here, minimization of relative error may correspond to substantial alignment of the sampling times of the samplers 102 and 104. As alluded to above, this may or may not mean that the edges of the clocks 110 and 116 are precisely aligned. In the latter case, the clocks may be locked yet have a relative phase offset (e.g., corresponding to clock and/or data delays in the system).

Figure 2:
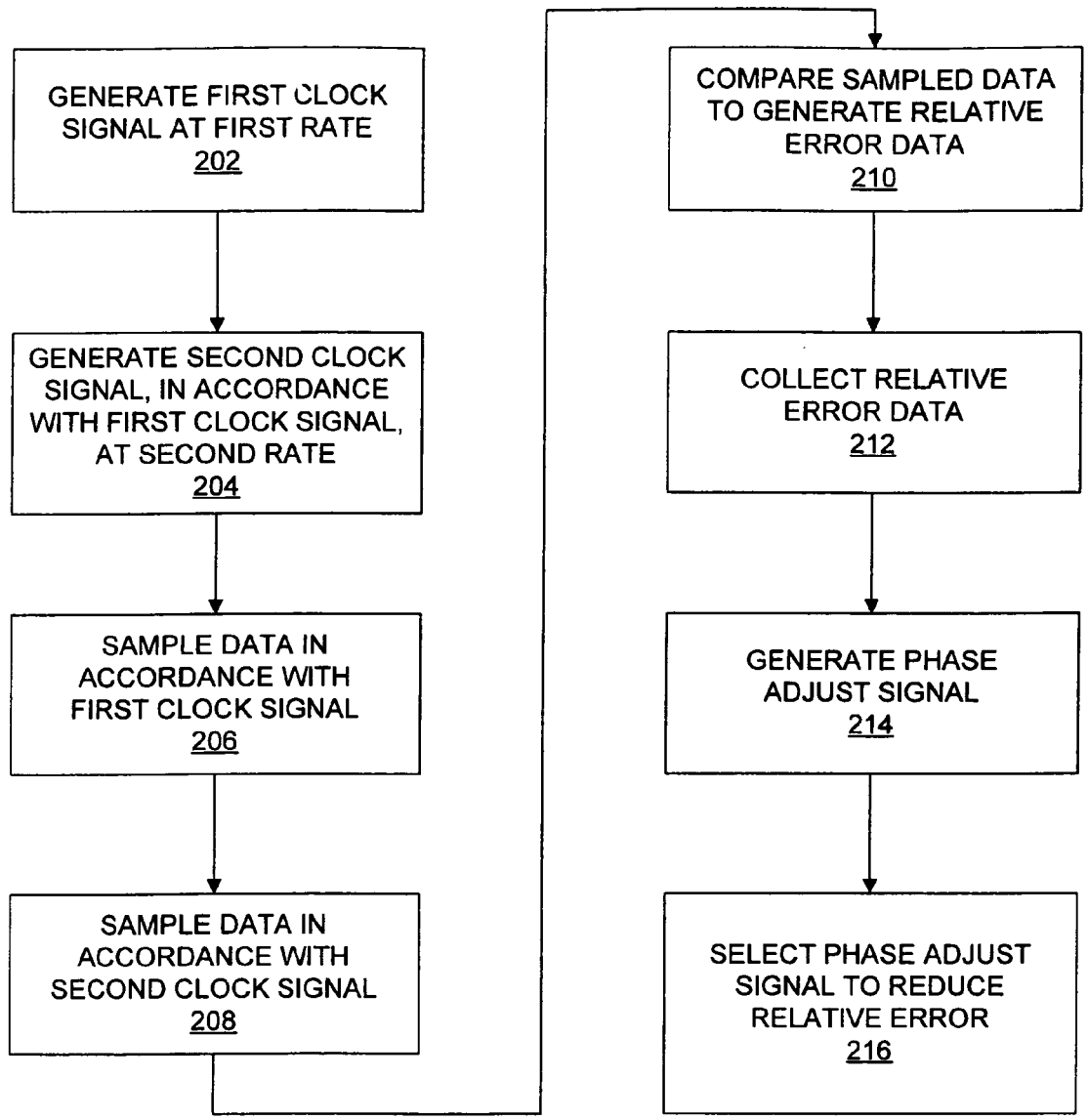
FIG. 2 is a flow chart of one embodiment of relative error operations that may be performed in accordance with the invention.

FIG. 2 illustrates one embodiment of operations that may be performed by a relative error compensation system such as the one depicted in FIG. 1. As represented by block 202, the system generates a first clock signal at a first clock rate. In addition, as represented by block 204, the system generates a second clock signal at a second clock rate. The second clock signal may be related to the first clock signal. For example, the second clock signal may be derived from the first clock signal. In addition, the second clock rate may be different (e.g., slower) than the first clock rate.

As represented by block 206, the system samples data in accordance with the first clock signal. For example, the first clock signal may be used to drive a flip-flop, a sample-and-hold circuit, an analog to digital converter, etc.

As represented by block 208, the system samples data in accordance with the second clock signal. Again, the second clock signal may be used to drive a flip-flop, a sample-and-hold circuit, an analog to digital converter, etc. The data sampled by the second clock signal is related to the data sampled by the first clock signal. For example, the same data signal may be coupled to two different samplers. However, in some applications a data signal received by one sampler may be delayed with respect to the data received by another sampler. In addition, one or both of the data signals may be processed by one or more components in the system before the signal is sampled.

As represented by blocks 210 and 212, the system compares the sampled data to generate relative error data (e.g., data matches, data does not match) and collects the relative error data over a period of time. Data may be collected over time to, for example, reduce the effects of noise and transient conditions in the system on the accuracy of the relative error data.

As represented by block 214, the system generates a phase adjust signal that adjusts the phase of the first clock signal and/or the second clock signal. As represented by block 216, the system may compare the sampled data and recollect the relative error data (block 210 and 212) for different values of the phase adjust signal in order to determine a value of the phase adjust signal that minimizes the relative error. For example, the system may set the phase adjust signal to a first value and accumulate a given number of samples of relative error data, then set the phase adjust signal to a second value and accumulate the same number of samples of relative error data. This procedure may be performed for all possible values of the phase adjust signal. The system may then compare the accumulated relative error data for each value of the phase adjust signal to identify the value that results in the lowest accumulated relative error, such as at block 216.

A relative error compensation system as described herein may be used in a variety of applications. For example, a receive equalizer that uses an analog to digital converter for an adaptation path may need to ensure that the phase of the sampling clock for the analog to digital converter is aligned with the phase of the sampling clock for a clock and data recovery circuit. In some embodiments the receive equalizer first equalizes the received data then samples the data using a high speed clock. Here, the equalizer adaptation may be performed at a slower rate than the rate of the high speed clock. Thus, a slower clock may be used to clock the analog to digital converter. However, the clock for the analog to digital converter may need to be phase adjusted with respect to the high speed clock so that the sample data that is used for the equalization operation coincides with the output data that was generated using the high speed clock. Any significant deviation in this timing may result in performance degradation in the system.

Advantageously, the relative error compensation technique may be used to compensate for delay mismatches that result from data delays (e.g., different delays in the data paths to the samplers) and/or clock delays (e.g., different delays in the clock paths to the samplers, different sample and hold times, etc.). This may provide an advantage over conventional techniques that only compensate for clock mismatches.

Moreover, by optimizing the clock phase based on relative error, the clock phase adaptation loop may operate relatively independent of other adaptation loops in a system. For example, in a receiver that incorporates an adaptive equalizer the adaptive equalization coefficients may be based on an error that is derived from subsamples of the equalized data. In this case, a relative error adaptation loop that adjusts a clock used to generate the subsamples may operate relatively independently of the equalization adaptation loop.

Furthermore, by optimizing the clock phase based on relative error, the clock phase adaptation loop may operate relatively independent of other characteristics of a system. For example, in the receiver mentioned above, the relative error adaptation loop may not be dependent on the characteristics of the communication channel.

Figure 3:
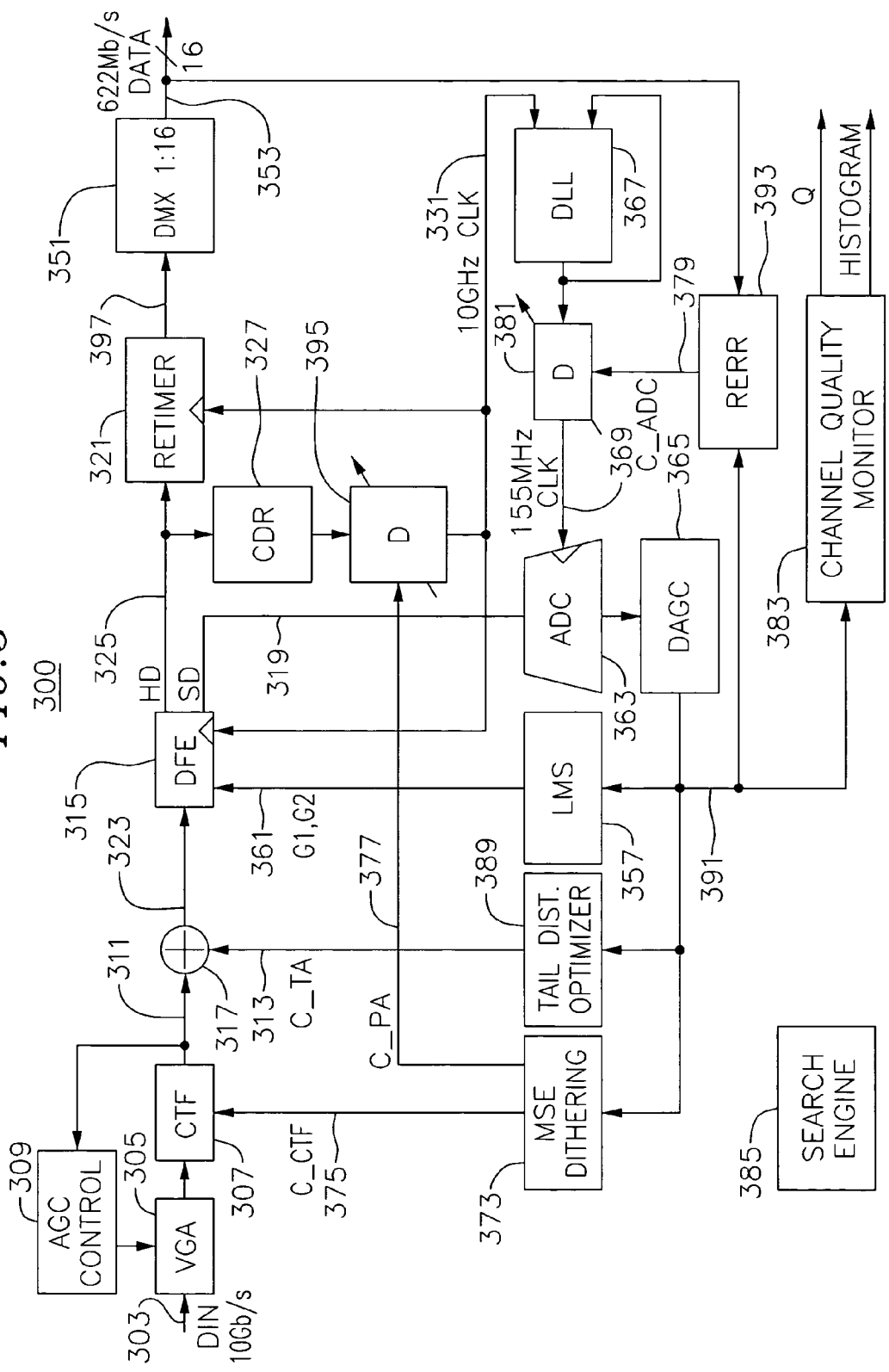
FIG. 3 is a simplified block diagram of one embodiment of a data communication receiver constructed in accordance with the invention.

FIG. 3 is a simplified diagram of one embodiment of a communication receiver 300 that incorporates a relative error compensation circuit. In this embodiment, the relative error compensation circuit is used to adjust a phase of a clock for an analog to digital converter that digitizes a soft decision signal to generate an error signal that is used in several adaptation loops in the receiver 300.

In an exemplary embodiment, the receiver recovers data from a 10 Gbits per second ("Gbps") serial data signal received from, for example, an optical channel. The receiver employs an adjustable continuous time filter ("CTF") and a decision feedback equalizer ("DFE") to reduce errors in the data recovered from the received signal. The receiver 300 also includes a clock recovery circuit and an analog to digital clock ("ADC") circuit, both of which include mechanisms for adjusting the phase of the generated clock. It should be appreciated, however, that the compensation techniques described herein are equally applicable to other applications including other receiver types, architectures, data rates and control loops.

Upon receiving an input data signal 303, the receiver 300 initially amplifies and filters the signal 303. A variable gain amplifier ("VGA") 305 amplifies the input data signal 303 and provides the amplified data signal to a continuous time filter 307. The continuous time filter 307 filters the data signal using, for example, a low pass filter that has an adjustable bandwidth. In the embodiment of FIG. 3, a dithering algorithm circuit 373 provides a bandwidth adjust signal ("C_CTF") 375 to control the bandwidth of the continuous time filter 307. By adjusting this bandwidth via the control signal 375, the dithering algorithm circuit 373 may reduce the mean square error ("MSE") of a signal recovered (e.g., signal 397 discussed below) from the received signal 303.

An example of a continuous time filter having an adjustable bandwidth is disclosed in commonly owned U.S. patent application Ser. No. 10/774,724, filed Feb. 9, 2004, the disclosure of which is hereby incorporated by reference herein. An example of a variable gain amplifier and a continuous time filter is disclosed in commonly owned U.S. patent application Ser. No. 10/841,766, filed May 7, 2004, the disclosure of which is hereby incorporated by reference herein.

A filtered data signal 311 from the continuous time filter 307 is provided to an automatic gain control ("AGC") circuit 309. Under the control of the automatic gain control circuit 309 the variable gain amplifier 305 may appropriately amplify or attenuate small or large amplitude input signals, respectively, to generate an output signal having relatively constant amplitude.

An threshold adjust circuit 317 combines (e.g., adds) a control signal ("C_TA") 313 from a tail distribution optimizer 389 to the data signal 311 from the continuous time filter 307. A resultant signal 323 is then provided to a decision feedback equalizer ("DFE") 315 and a clock and data recovery circuit ("CDR") 327. The decision feedback equalizer 315 combines the data signal 323 with equalized feedback signals (not shown) that may be scaled by one or more equalizer coefficient signals 361 to generate a soft decision data signal 319. The decision feedback equalizer 315 also generates a hard decision data signal 325 (e.g., a binary data signal) by, for example, slicing the soft decision signal. In this embodiment, the binary signal 325 is retimed by a retimer 321 to generate a data signal 397 that constitutes equalized data that has been recovered from the incoming data signal 303.

A clock and data recovery ("CDR") circuit 327 extracts a 10 GHz clock signal 331 (in this 10 Gbps receiver example) from the binary data signal 325 by, for example, aligning the rising edge of the extracted clock 331 with transitions in the binary signal 325. In this way, the clock and data recovery circuit 327 may maintain a desired timing relationship between the binary data signal 325 and the clock signal 331 that the retimer 321 uses to retime the binary data signal 325.

The clock and data recovery circuit 327 incorporates a phase adjust circuit 395 that may be used to, for example, make relatively small adjustments in the phase of the clock signal 331. In one embodiment, the phase adjust circuit 395 is controlled by a control signal ("C_PA") 377 to adjust the phase of the clock 331. For example, the control signal 377 may create an offset in the detected phase relationship between the clock signal 331 generated by the CDR 327 and the binary data signal 325. By adjusting this delay via the control signal 377, the dithering algorithm circuit 373 may further reduce the mean square error of the signal recovered (e.g., signal 397) from the received signal 303. Examples of decision feedback equalizers with adjustable clock recovery delay are disclosed in commonly owned U.S. patent application Ser. No. 10/774,725, filed Feb. 9, 2004, the disclosure of which is hereby incorporated by reference herein.

In some embodiments, a demultiplexer ("DMX") 351 demultiplexes the recovered data signal 397 to generate parallel data signals that are clocked at a slower rate. For example, in FIG. 3 the demultiplexer 351 generates sixteen parallel data signals 353 at a rate of 622 Mbits per second ("Mbps").

In some embodiments, the decision feedback equalizer 315 has an internal feedback loop (not shown in FIG. 3). The internal feedback signals are multiplied by (in this two-tap equalizer example) equalization coefficients G1 and G2 (typically negative numbers) provided by signals 361. The resulting scaled equalized feedback signals are added by an internal summer (not shown in FIG. 3) to the data signal 323. Thus, the decision feedback equalizer 315 may subtract a scaled version of one or more previous symbols from a current (that is, current in time) symbol to reduce or eliminate channel induced distortion such as inter-symbol interference.

In general, the values of the equalization coefficients G1 and G2 depend on the level of inter-symbol interference that is present in the incoming data. Typically the absolute value of an equalization coefficient increases with increasing inter-symbol interference. In some embodiments, a least mean square ("LMS") algorithm circuit 357 calculates an error associated with an equalized signal (e.g., the soft decision signal 319) and adjusts the values of the equalization coefficients G1 and G2 in accordance with the error.

In FIG. 3, error information for the adaptation paths is obtained from a digitized version of the soft decision signal 319. An analog to digital converter 363 samples the soft decision signal 319 to generate digital signals that are provided to a digital automatic gain control circuit ("DAGC") 365. The digital output 391 of the digital automatic gain control circuit 365 is then provided to the adaptations loops.

In some embodiments the analog to digital converter 363 samples the soft decision signal 319 using a 155 MHz clock signal 369 generated by a delay lock loop 367. The relative phase of the clock signal 369 determines the point in time in a given symbol of the signal 319 at which the analog to digital converter 363 samples the symbol.

In some embodiments the delay lock loop 367 works in conjunction with a variable delay circuit 381 that may be used to control, to some degree, the phase of the clock signal 369. A relative error circuit 393 may adjust a delay control signal ("C_ADC") 379 to vary the point at which the analog to digital converter 363 samples symbols from the soft decision signal 319. In this way, the analog to digital converter 363 may be controlled to sample at approximately the same point in time as the retimer 321. In the embodiment of FIG. 3, the relative error circuit 393 adjusts the correction signal 379 based on at least a portion of output signal 353 and the DAGC output signal 391.

As mentioned above, the DAGC output signal 391 is used in several adaptation loops in the receiver 300. For example, the dithering algorithm circuit 373 uses the signal 391 to generate several signals to control the operations of various components in the receiver 300. Specifically, the bandwidth adjust signal 375 controls the bandwidth of the continuous time filter 307 and the phase adjust signal 377 controls the phase adjust circuit 395 to adjust the phase of the clock signal 331. In addition, the phase adjusted clock signal 331 affects the timing of the clock 369 generated by the delay lock loop 367 for the analog to digital converter 363. In other embodiments, the dithering algorithm may control any number of coefficients, values, loops or other parameters.

In some embodiments, the dithering algorithm circuit 373 modifies the signals 375 and 377 according to a mean square error associated with a received data signal. In FIG. 3, the mean square error is calculated from the soft decision signal 319 generated by the decision feedback equalizer 315. The dithering algorithm circuit 373 may reduce MSE by measuring MSE, then adjusting one or more of the signals 375 and 377, then re-measuring the MSE to compare the new MSE with the prior MSE. If the MSE decreased, the circuit 373 continues to adjust the signals in the same direction (e.g., up or down) as before. If the MSE increased, the circuit 373 adjusts the signals in the opposite direction.

The signal 391 also may be used by adaptation processes such as a threshold adjustment loop and an ADC clock delay adaptation loop as discussed herein. Moreover, it should be appreciated that the signal 391 may be used in other adaptation loops and that the above or other adaptations loops may use one or more other signals as a basis for adjusting control signals (e.g., coefficients) for the loops.

In some embodiments the components 357, 365, 373, 389 and 393 are implemented in the digital domain. Other components such as a search engine 385 that generates initial coefficient values for the adaptation loops and a channel quality monitor 383 also may be implemented in the digital domain. Accordingly, these components may be implemented, for example, as microcode for microprocessors, programmable logical grid arrays, as a state machine, a processor with associated software or similar structures and devices.

Figure 4:
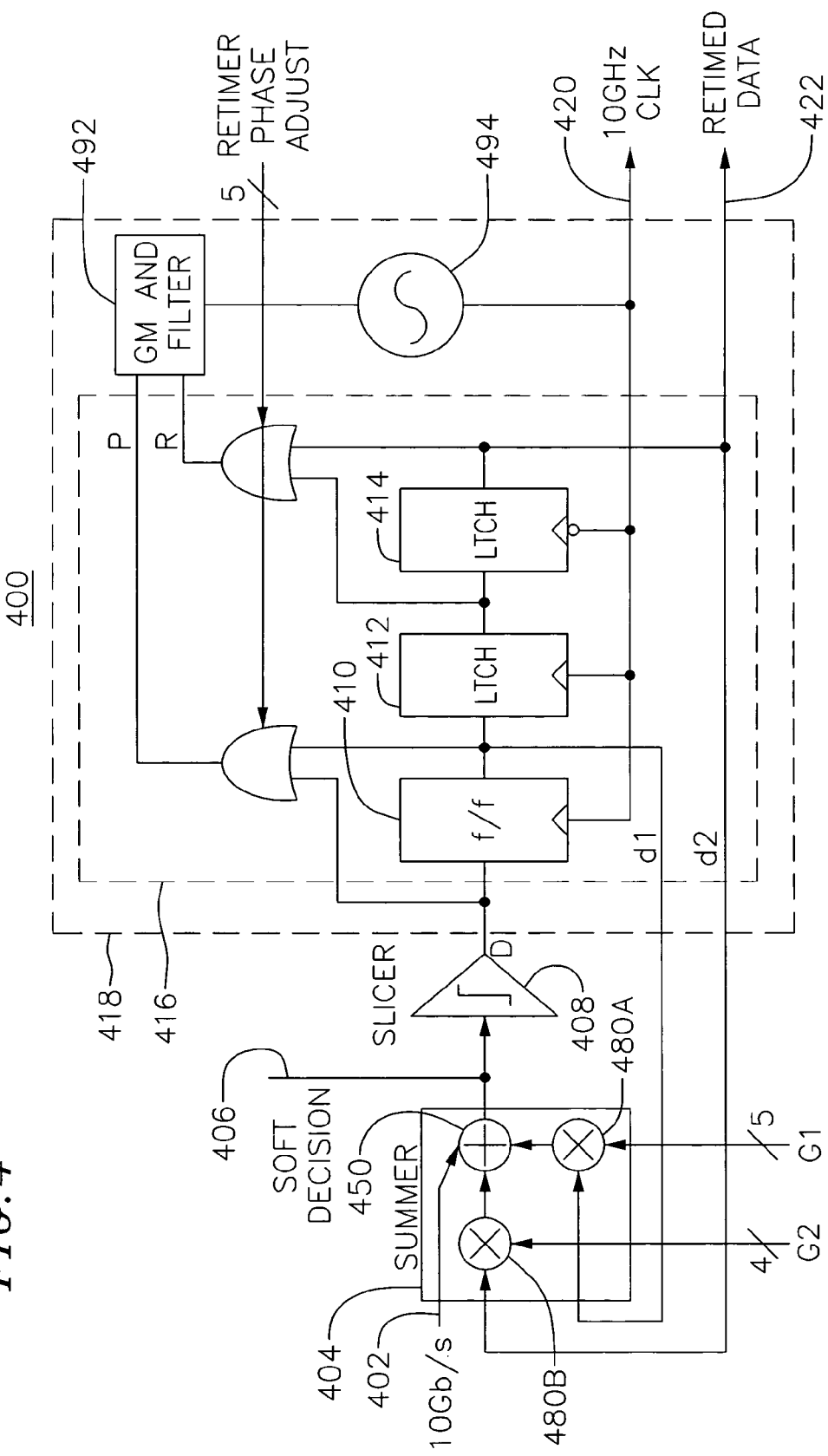
FIG. 4 is a simplified block diagram of one embodiment of a decision feedback equalizer and clock and data recovery circuit constructed in accordance with the invention.

As discussed above, the relative error circuit 393 compares the output data 353 with the sampled data 391 to adjust the phase of the sampling clock for the ADC 363. FIG. 4 illustrates in more detail one embodiment of a two tap decision feedback equalizer and clock and data recovery circuit 400 that may be used to generate these signals.

The embodiment of FIG. 4 equalizes received data before it is retimed and incorporates an integrated phase detector and retimer. For example, an input signal 402 is equalized at a summer 404 that adds equalizer feedback signals d1 and d2 (as scaled by coefficients G1 and G2) to the input signal 402. The resultant soft decision signal 406 is provided to a slicer 408 and the output (D) of the slicer 408 is provided to a clock and data recovery circuit (represented by the components within dashed box 418) that extracts a clock signal 420 and retimes the received data to generate an output signal 422. By equalizing and retiming data in this manner, signal delay problems and clock recovery problems resulting from ISI that exist in conventional devices may be avoided. Accordingly, this architecture may facilitate operation at higher data rates and may operate more effectively in systems with relatively high ISI.

The phase detector comprises the components within dashed box 416. Here, it may be seen that latches in the phase detector are used to generate the retimed data 422. Specifically, the CDR phase detector flip-flops (flip-flop 410 and latch pair 412 and 414) also function as DFE retimers. These flip-flops may be shared because in the architecture of FIG. 4 the flip-flops for the CDR phase detector may operate from the same signals (e.g., binary data signal (D) and the extracted clock signal 420) as would the flip-flops for a DFE retimer. By integrating these phase detector and retimer components this architecture serves to advantageously reduce the number of high-speed components in the receiver.

The data output signals from the two flip-flops also provide the DFE tap signals (d1 and d2) for the DFE feedback loop. The output signals d1 and d2 are multiplied by equalization coefficients G1 and G2 at multipliers 480A and 480B, respectively, and provided to an adder 450. The adder 450 then combines the equalization signals with the input signal 402.

As discussed above, a slicer 408 digitizes the output 406 of the summer 404 to generate the binary data signal (D) that is provided to the first flip-flop 410. In this embodiment, the output of the second flip-flop provides the recovered data signal 422.

Outputs P and R from the phase detector 416 are provided to a charge pump and loop filter 492 which provides a voltage signal to a voltage controlled oscillator ("VCO") 494. The VCO 494 generates the extracted clock signal 420 that clocks the two flip-flops.

In some embodiments the soft decision signal 406 is used to generate error data for the adaptation loops. For example, the signal 406 may comprise the signal 319 described above in conjunction with FIG. 3. Here, it may be desirable to ensure that the basis for the error data accurately corresponds to the actual data that is generated by the receiver (e.g., the retimed data 422). Accordingly, provisions may be made to ensure that a sampler (e.g., ADC 363 in FIG. 3) samples a symbol in the soft decision signal 406 at a point in time (e.g., a given position in a time representation of the symbol) that corresponds to when the retimer (e.g., flip-flop 410) samples a symbol in the data (D). These timing issues will be described in more detail in conjunction with the circuit shown in FIG. 5.

Figure 5:
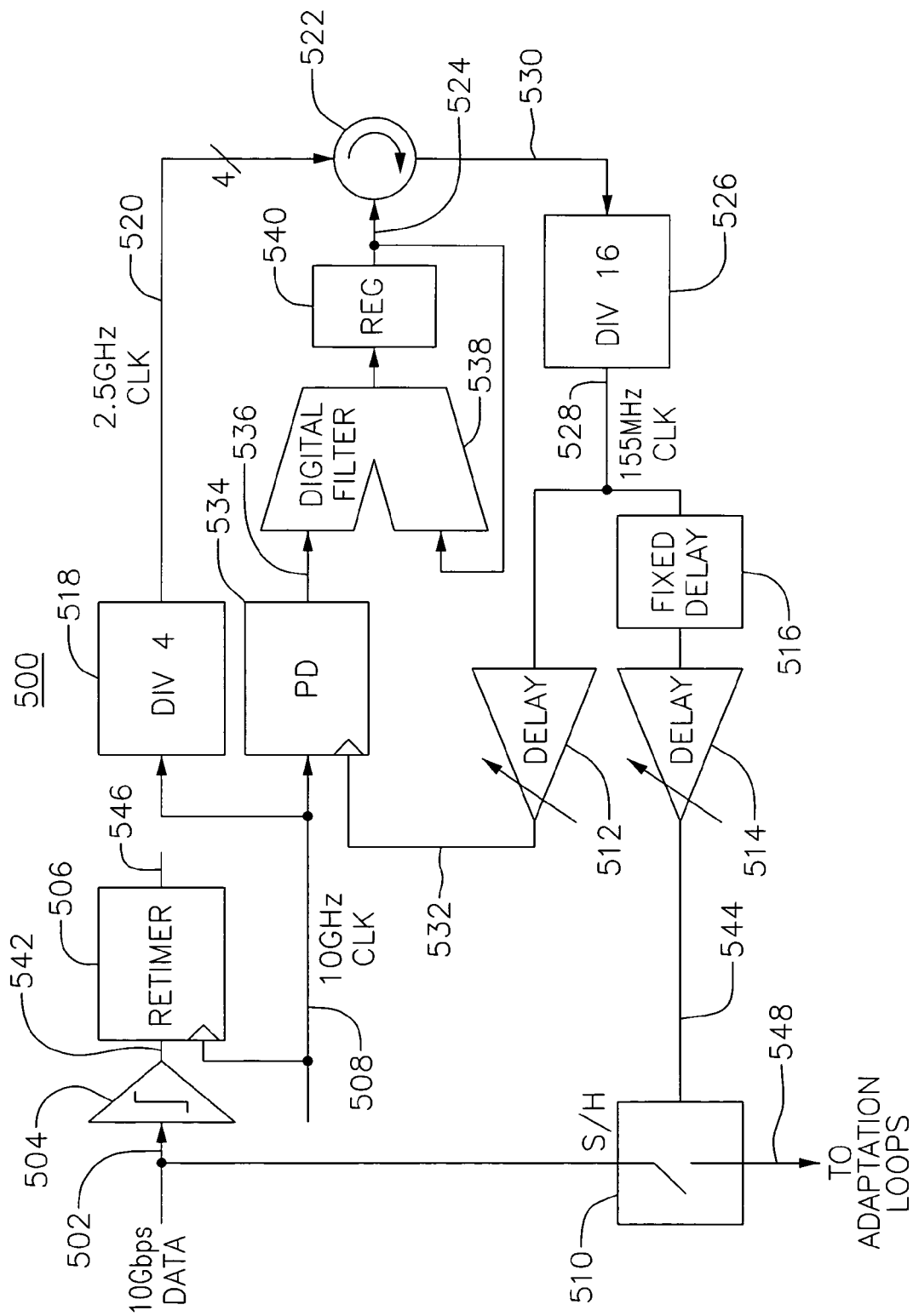
FIG. 5 is a simplified block diagram of one embodiment of a delay lock loop and analog to digital converter circuit constructed in accordance with the invention.

FIG. 5 illustrates one embodiment of a delay lock loop and analog to digital converter timing circuit 500. An input signal 502, a slicer 504, a retimer 506 and an extracted clock signal 508 may respectively correspond to the signal 406, the slicer 408, the retimer (flip-flop 410 and latches 412 and 414) and the signal 420 in FIG. 4. Similarly, these components may respectively correspond to the signal 319, the slicer (in DFE 315), the retimer 321 and the signal 331 in FIG. 3. A sample and hold ("S/H") circuit 510 may correspond to the ADC 363 in FIG. 3. Variable delay buffers 512 and 514 and optional fixed delay element 516 may correspond to the variable delay element 381 in FIG. 3. For convenience, a delay adjust input signal (e.g., signal 379 in FIG. 3) is not illustrated in FIG. 5.

The remaining components shown in FIG. 5 may correspond to the delay lock loop 367 of FIG. 3. For example, the delay lock loop may comprise a divide-by-four circuit 518 that generates a 2.5 GHz clock signal 520 from the 10 GHz clock signal 508. The signal 520 comprises an input to a phase interpolator 522 that is controlled by a control signal 524. A divide-by-sixteen circuit 526 generates a 155 MHz clock signal 528 from an output 530 of the phase interpolator 522. The delay buffer 512 delays the signal 528 to provide a 155 MHz clock 532 to a phase detector 534. The phase detector 534 generates an error signal 536 in accordance with the phase difference between the signals 532 and 508. A circuit including a filter 538 and a register 540 filters and accumulates the error signal 536 to generate the control signal 524.

As discussed above, it may be desirable to ensure that the sample-and-hold circuit 510 samples a symbol in the soft decision signal 502 at a point in time (e.g., a position in a time representation of the symbol) that corresponds to when the retimer 506 samples a symbol in its input data 542 (e.g., data (D) in FIG. 4). For example, if one sampler is sampling in the middle of the "eye" of a given symbol, it is desirable to have the other sampler also sample in the middle of the "eye" of its sample.

A conventional phase alignment (e.g., PLL or DLL) scheme may not provide the desired correlation between the sample times of the sample-and-hold circuit 510 and the retimer 506. For example, in a conventional scheme the delay elements 512, 514 and 516 may not be present. Thus, the 155 MHz clock 528 may be used to clock the sample-and-hold circuit 510 and would serve as the lower input signal (instead of signal 532) to the phase detector 534.

Even assuming, however, that the delay lock loop was capable of perfectly aligning the clock signals 508 and 528, the sampling times of the retimer and the sample-and-hold circuit 510 would differ due to the delay imparted by the slicer 504 on the signal 542 sampled by the retimer 506. Moreover, in practice, additional phase inaccuracies may be imparted on the clocks 508 and 528 by other components of the system. For example, the sample and hold times of the samplers 506 and 510 may differ. In addition, the phase detector 534 may not precisely detect phase differences and/or generate absolutely precise error signals to compensate for the phase differences. Also, the delays in the circuit may vary depending on the temperature of the circuit.

To compensate for these delays, the delay elements 512, 514 and 516 may be used to adjust the relative phase of the clock 508 that is used to generate output data 546 and a clock 544 that is used to generate data 548 for the adaptation loops. Here, the fixed delay element 516 may be used to coarsely compensate for the delays in the circuit. For example, the delay of the element 516 may be set to a value that corresponds to typical delays (e.g., the delay through the slicer 504, etc.) in the circuit.

The delay elements 512 and 514 may be used to adjust the relative phases of the clocks 508 and 544. For example, an increase in the delay of the delay element 512 and/or a decrease in the delay of the delay element 514 will cause the phase of the clock 544 to move in a leading direction with respect to the clock 508. Conversely, a decrease in the delay of the delay element 512 and/or an increase in the delay of the delay element 514 will cause the phase of the clock 544 to move in a lagging direction with respect to the clock 508.

Figure 6:
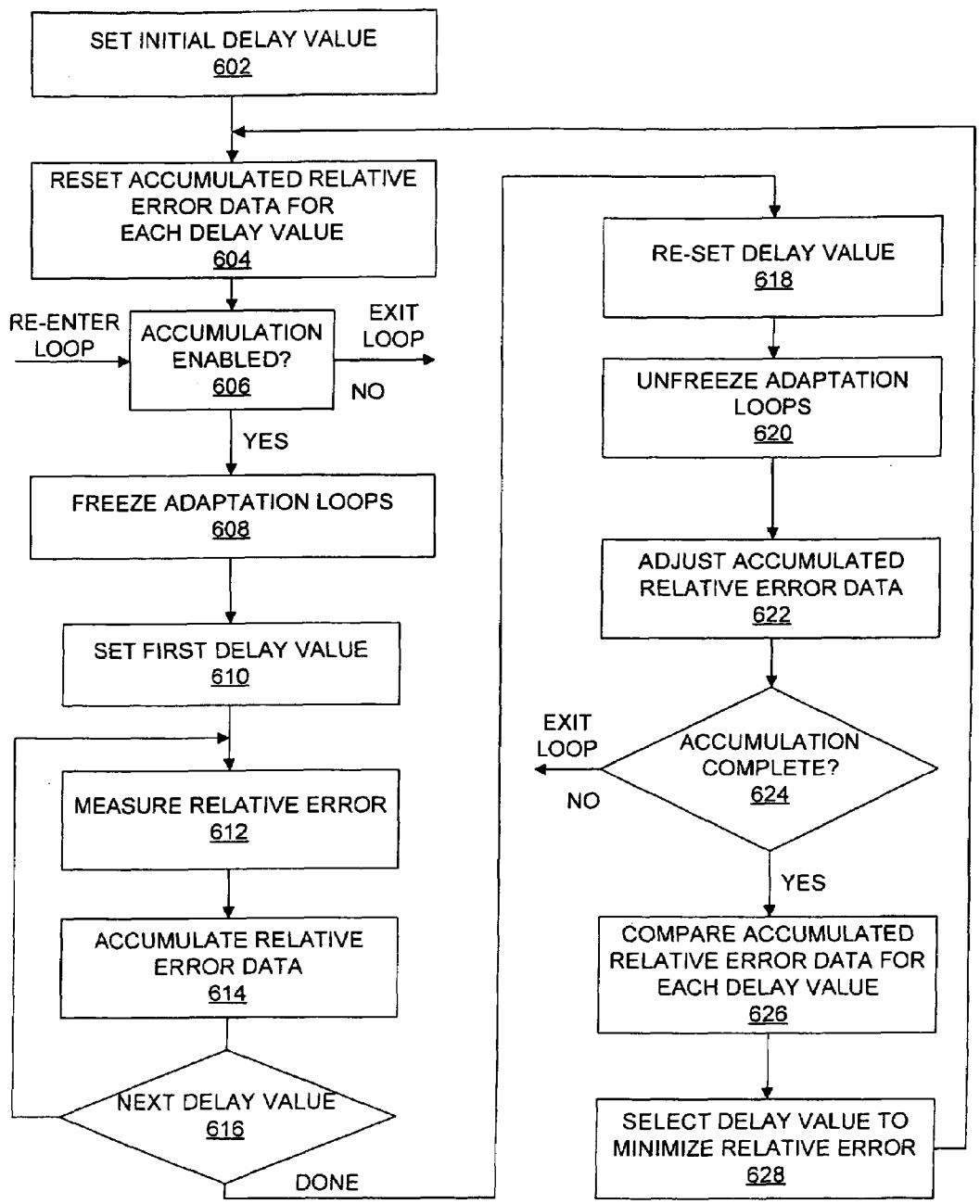
FIG. 6 is a flow chart of one embodiment of relative error operations that may be performed in accordance with the invention.

With the above timing issues in mind, one embodiment of a method of controlling the relative phase of sampling clocks (e.g., signals 508 and 544) will be discussed in conjunction with FIG. 6. In particular, the method of FIG. 6 may be used in a communications receiver that incorporates adaptation loops such as the receiver 300 illustrated in FIG. 3.

As represented by block 602, one or more initial delay values are selected for the variable delay element(s). A variety of techniques may be used to select these initial delay values. For example, an initial delay value may be set to a value in the middle of the delay range. This may be achieved, for example by setting the delays of elements 512 and 514 to their minimum values. Alternatively, the delay may be set to a last known value or an algorithm (e.g., executed by a search engine) may be used to relatively quickly calculate a value that may be near an optimum value.

In some embodiments the method involves accumulating relative error data for each possible delay value. Thus, accumulators such as registers, data memory locations, etc., may be provided to store relative error information associated with each delay value. Thus, as represented by block 604, as each new accumulation process commences, any prior accumulated relative error information may be cleared from the accumulators.

In some embodiments the procedure may be invoked intermittently (or periodically, etc.) over a period of time. This may be done because it may be desirable to make a relative large number of relative error measurements. For example, taking a large number of measurements may reduce any adverse effects noise, transient conditions, etc., in the system may have on a given relative error measurement (e.g., a comparison of the sampled data symbols from signals 391 and 353 in FIG. 3).

Varying the delay values over a relatively long period of time may, however, adversely affect the operation of the system. For example, as shown in FIG. 3 other adaptation loops may use the data generated by the ADC 363. Since these loops also may be trying to converge to a desired coefficient value, continually modifying the clock that generates this data may cause instability in the system.

The above problem may be avoided by only occasionally performing the relative error procedure. For example, other, more important adaptation loops in the system such as those that generate the DFE and CTF coefficients are allowed to operate at their normal intervals and without modification of the ADC timing. The ADC timing may then be adjusted by enabling the relative error procedure at times when the other loops are not operating (e.g., between the operating intervals of these loops). This does not mean, however, that the ADC timing loop cannot be performed when the receiver is operating. Rather, in general, the ADC clock phase does not impact the main operation of the receiver. That is, changes in the ADC delay values may not corrupt the output data of the receiver.

It should be appreciated that as a result of this intermittent technique a longer time may be needed for the ADC timing adaptation loop to converge (e.g., find the optimum delay value). However, the factors that affect the ADC timing may not change as quickly as the factors (e.g., channel dispersion) that affect other adaptation loops (e.g., generation of the DFE coefficients). For example, typical factors that may affect the ADC timing loop include temperature variations (relatively slow) and process variations (constant once the integrated circuit is manufactured). Moreover, these factors may not involve channel variations. Accordingly, the ADC timing loop may be operated at a slower rate than adaptation loops that are channel dependent.

As represented by block 606, the method thus involves determining whether the accumulation procedure for the ADC timing loop is enabled. If it is not, the accumulation process is not performed. If the procedure is enabled, the operations following block 606 are performed.

As discussed above, several iterations of the accumulation procedure may be invoked before sufficient relative error data has been accumulated. Accordingly, the loop may be re-entered such that the accumulators may already contain relative error data from prior iterations of the loop.

As represented by block 608, to prevent the changes to the delay values from adversely affecting the operation of other adaptation loops in the system and vice versa, the other adaptation loops may be temporarily disabled. It should be understood, however, that provisions may be made to ensure that other more critical adaptation loops are not disabled for too long of a period of time so that, for example, the system will adequately compensate for changes in the system. In the embodiment of FIG. 3, the loops that calculate coefficients for one or more of the signals 375, 377, 313 and 361 may, for example, be disabled. In addition, the adaptation of the delay lock loop may be disabled to, for example, prevent the delay lock loop from interfering with the modification of the delay values.

Blocks 610 through 616 comprise an inner loop that collects relative error for each delay value. Initially, at block 610, the delay (e.g., signal 379 in FIG. 3) is set to one of the values (e.g., −7 in a system where the values may range from −7 to +7).

As represented by block 612, relative error between the input data is collected for one or more symbols (e.g., data bits). In some embodiments the relative error operation consists of an XOR of the two inputs. Thus, if the data bits are the same value the relative error measurement is a "0." If the data bits are not the same value, the relative error measurement is a "1." In embodiments where several measurements (e.g., collecting data for 128 155 MHz clock cycles at block 612) are made, each relative error measurement may be added to the accumulator that corresponds to the current delay value (block 614). This may be accomplished, for example, by incrementing a counter (e.g., a register) every time the XOR operation results in a "1."

As represented by block 616, the relative error data is measured and accumulated for the other delay values. In the example above, this may involve setting the delay value to each of the values −6, −5, . . . , 0, . . . +6, +7, and performing the operations of blocks 612 and 614 for each of these values.

Once the entire inner loop has been performed, the system sets the delay value back to the value that was used before block 610 and the adaptation loops are unfrozen (blocks 618 and 620). This enables the system to resume normal operations.

As represented by block 622, the accumulated relative error data in all of the accumulators may occasionally be reduced. This operation may be performed to eliminate the need for very large accumulators. In some embodiments the value in each accumulator is reduced, for example, by the amount in the accumulator with the smallest current accumulated value. Alternatively, reducing the accumulated values may be accomplished by right shifting the data in each accumulator by a predefined or selected number of bits. This operation may be performed at various times such as, for example, randomly, periodically, in response to stimuli such as a minimum or maximum current value in one or more of the accumulators, etc.

The loop represented by blocks 608-622 may be performed several times to accumulate a desired amount of relative error data. For example, in some embodiments approximately one million relative error measurements may be accumulated. If the desired amount of data has not been accumulated at block 624, the procedure may exit the loop until the next ADC clock adaptation loop is enabled. As discussed above in conjunction with block 606, when the loop is re-enabled operations may commence at block 608.

If the desired amount of data had been accumulated at block 624, the process compares the contents of all of the accumulators (block 626). In this way, the process may identify which delay value resulted in the lowest accumulated error (block 628). In some embodiments, when more than one accumulator contains the lowest accumulated value, the process may select the desired delay value by averaging the delay values associated with those accumulators. After the system sets the delay value to the selected delay value, the process returns to the beginning of the process to continue to adapt the delay value in accordance with current operating conditions.

In some embodiments, the operating parameters referred to above may be selected based on empirical measurements of the system, simulations or other criteria. These operating parameters may include, for example, the number of samples accumulated, the number of measurements made during each pass through the loop and other factors such as the period of time the algorithm is disabled or the time within which the algorithm is allowed to complete. As discussed herein, factors to be considered in selecting these operating parameters may include, for example, ensuring that the system remains stable and ensuring that the adaptation loops are fully executed frequently enough to adequately adapt to changing conditions in the system.

One example of operating parameters follows. In some embodiments the frequency at which the ADC adaptation loop is performed is the same as the frequency at which the CDR phase adjust signal adaptation loop is performed. In addition, the amount of time each iteration of the ADC loop is enabled is equal to two segments where each segment consists of 1024 ADC clock cycles (e.g., at 155 MHz). The number of measurements taken at block 612 is based on the enable time divided by the number of delay values: floor (2048/15). The number of times through the loop 608-622 is $2^{15}$. Thus, the relative error comparisons at block 626 is performed over $2^{23}$ which is approximately $10^7$ bits.

Figure 7:
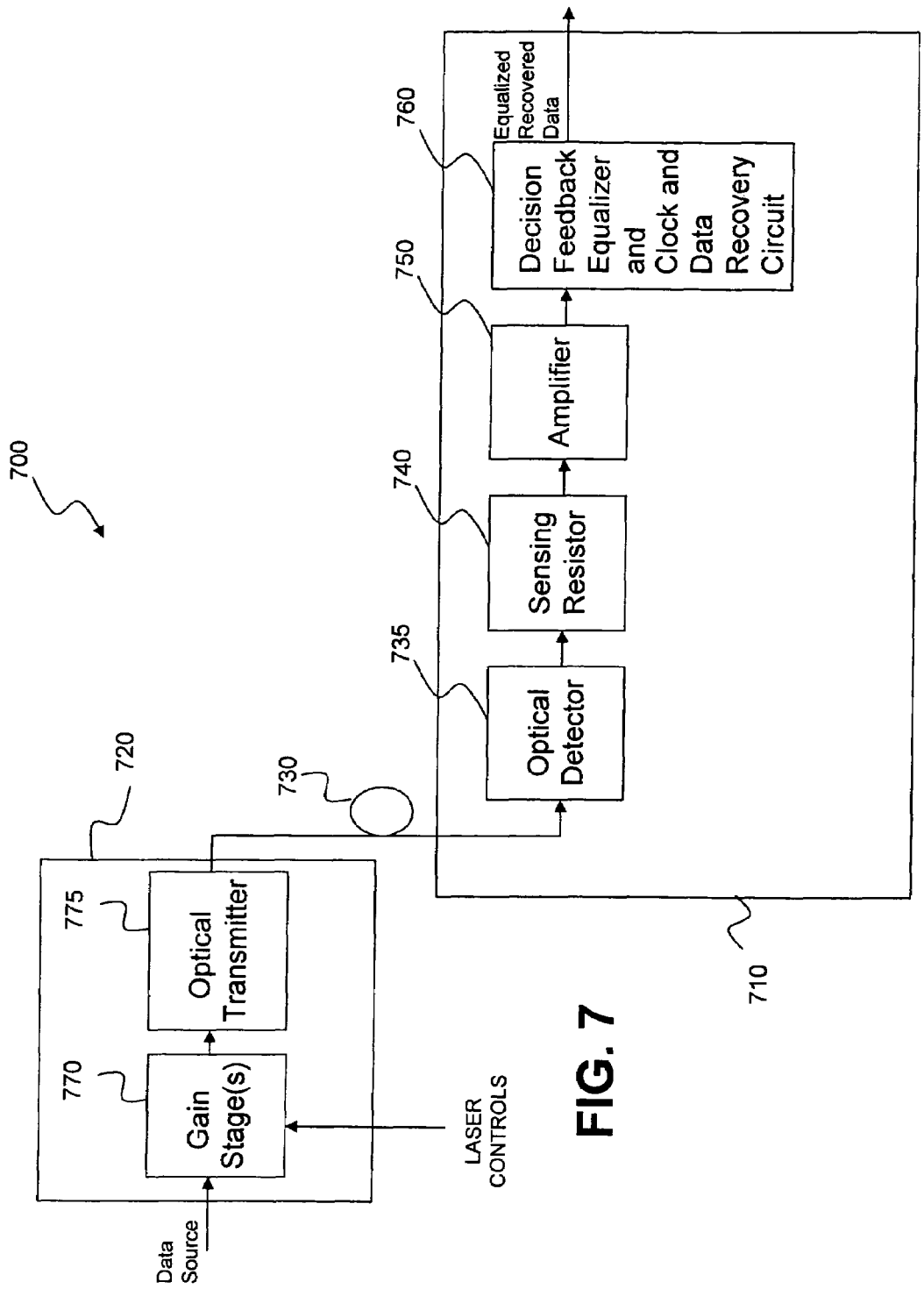
FIG. 7 is a simplified block diagram of one embodiment of an optical communication system.

The teachings herein may be incorporated into a variety of applications. For example, referring to FIG. 7, the described circuits may be incorporated into an optical receiver assembly 710 of an optical communication system 700. The optical system 700 includes an optical transmitter 720 and an optical fiber network 730 that carries the optical signal to the optical receiver assembly 710. Those skilled in the art will appreciate that the present invention is not limited to a single optical transmitter and receiver. That is, optical communications systems may incorporate one or more optical transmitters as well as one or more optical receivers.

The illustrated receive path includes an optical detector 735, sensing resistor 740, one or more amplifiers 750 and a decision feedback equalizer and clock and data recovery circuit 760. The optical detector 735 can be any known prior art optical detector. Such prior art detectors convert incoming optical signals into corresponding electrical output signals that can be electronically monitored.

A transmit path includes, by way of example, one or more gain stage(s) 770 coupled to an optical transmitter 775. In one embodiment an analog data source provides an analog data signal that modulates the output of the optical transmitter. In other embodiments baseband digital modulation or frequency modulation may be used. In this embodiment the gain stage(s) amplify the incoming data signal and the amplified data signal in turn drives the optical transmitter 775.

The gain stage 770 may have multiple stages, and may receive one or more control signals for controlling various different parameters of the output of the optical transmitter. The optical transmitter may, for example, be a light emitting diode or a surface emitting laser or an edge emitting laser that operates at high speeds such as 10 Gigabits per second (Gbps) or higher.

A receive fiber optic cable 730 carries an optical data signal to the optical detector 735. In operation, when the transmitted optical beam is incident on a light receiving surface area of the optical detector, electron-hole pairs are generated. A bias voltage applied across the device generates a flow of electric current having an intensity proportional to the intensity of the incident light. In one embodiment, this current flows through sensing resistor 740, and generates a voltage.

The sensed voltage is amplified by the one or more amplifiers 750 and the output of amplifier 750 drives the decision feedback equalizer. As illustrated in FIG, 4, the decision feedback equalizer, includes, by way of example, a slicer that generates a binary signal (D) that drives the clock and data recovery circuit. The clock and data recovery circuit generates an extracted clock signal from the binary signal which is provided to a retimer (e.g., as illustrated in FIG. 5) to retime the equalized data.

It should be appreciated that the various components and features described herein may be incorporated in a system independently of the other components and features. For example, a system incorporating the teachings herein may include various combinations of these components and features. Thus, not all of the components and features described herein may be employed in every such system.

Different embodiments of the invention may include a variety of hardware and software processing components. In some embodiments, hardware components such as controllers, state machines and/or logic are used in a system constructed in accordance with the invention. In some embodiments code such as software or firmware executing on one or more processing devices may be used to implement one or more of the described operations.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards. In some embodiments some of the connections represented by the lead lines in the drawings may comprise a data network, for example, a local network and/or a wide area network (e.g., the Internet).

The signals discussed herein may take several forms. For example, in some embodiments a signal may be an electrical signal transmitted over a wire while other signals may consist of light pulses transmitted over an optical fiber.

A signal may comprise more than one signal. For example, a signal may consist of a series of signals. Also, a differential signal comprises two complementary signals or some other combination of signals. In addition, a group of signals may be collectively referred to herein as a signal.

Signals as discussed herein also may take the form of data. For example, in some embodiments an application program may send a signal to another application program. Such a signal may be stored in a data memory.

The components and functions described herein may be connected/coupled directly or indirectly. Thus, in some embodiments there may or may not be intervening devices (e.g., buffers) between connected/coupled components.

A wide variety of devices may be used to implement the data memories discussed herein. For example, a data memory may comprise flash memory, registers, RAM, ROM, one-time-programmable (OTP) memory or other types of data storage devices.

In summary, the invention described herein generally relates to an improved phase adjust system and method. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. For example, a variety (e.g., type and/or number) of signals, circuits and techniques may be used to adjust the relative phases of two or more signals and to calculate relative error between two or more signals. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A method of sampling data comprising:
   providing a first sampling of data from at least one data signal;
   providing a second sampling of data from the at least one data signal;
   processing the first sampling and the second sampling to generate relative error measurements;
   accumulating the relative error measurements; and
   adjusting at least one of the first sampling and the second sampling in accordance with the accumulated relative error measurements.

2. The method of claim 1 wherein adjusting comprises adjusting phase of at least one clock used to provide the first sampling and the second sampling.

3. The method of claim 1 wherein adjusting comprises providing a phase offset between a plurality of clocks used to provide the first sampling and the second sampling to minimize the relative error measurements.

4. The method of claim 1 wherein providing the first sampling comprises generating a first clock signal at a first clock rate for sampling the least one data signal.

5. The method of claim 4 wherein providing the second sampling comprises generating a second clock signal at a second clock rate for sampling the least one data signal.

6. The method of claim 1 wherein processing the first sampling and the second sampling comprises calculating relative error between data bits from the first sampling and data bits from the second sampling.

7. The method of claim 6 wherein accumulating comprises accumulating the relative error between data bits from the first sampling and data bits from the second sampling.

8. The method of claim 1 wherein processing comprises at least one XOR operation.

9. The method of claim 1 wherein adjusting comprises identifying a phase delay, for at least one clock used to provide the first sampling and the second sampling, that provides a minimum accumulated relative error.

10. The method of claim 9 wherein adjusting comprises setting the phase delay, for the at least one clock used to provide the first sampling and the second sampling, to the identified phase delay.

11. The method of claim 1 wherein at least one adaptation loop in a receiver is adjusted in accordance with the second sampling of data.

12. The method of claim 11 wherein the at least one adaptation loop affects received signal quality in the receiver.

13. A method of aligning sampling clocks comprising:
generating a first clock signal at a first rate;
generating a second clock signal at a second rate;
sampling data from at least one data signal in accordance with the first clock signal;
sampling data from the at least one data signal in accordance with the second clock signal;
calculating relative error between the data sampled in accordance with the first clock signal and the data sampled in accordance with the second clock signal;
accumulating the relative error; and
adjusting a phase of at least one of the first clock signal and the second clock signal in accordance with the accumulated relative error.

14. The method of claim 13 wherein accumulating comprises accumulating relative error measurements associated with each of a plurality of phase settings for at least one of the first clock signal and the second clock signal.

15. The method of claim 13 wherein at least one adaptation loop in a receiver is adjusted in accordance with the data sampled in accordance with the second clock signal.

16. The method of claim 15 wherein the at least one adaptation loop affects signal quality of the data sampled in accordance with the first clock signal.

17. The method of claim 13 wherein the second clock signal is derived from the first clock signal.

18. The method of claim 13 wherein adjusting comprises providing a phase offset between the first clock signal and the second clock signal to minimize the relative error.

19. The method of claim 13 wherein calculating comprises calculating relative error between data bits from the data sampled in accordance with the first clock signal and the data bits from data sampled in accordance with the second clock signal.

20. The method of claim 19 wherein accumulating comprises accumulating the relative error between the data bits.

21. The method of claim 13 wherein calculating comprises at least one XOR operation.

22. The method of claim 13 wherein adjusting comprises identifying a phase delay, for at least one of the first clock signal and the second clock signal, that provides a minimum accumulated relative error.

23. The method of claim 22 wherein adjusting comprises setting phase delay for at least one of the first clock signal and the second clock signal to the identified phase delay.

24. A communications system comprising:
a decision feedback equalizer configured to generate a soft decision signal and a hard decision signal in accordance with a received signal;
at least one clock generator configured to generate a first clock signal in accordance with the hard decision signal and configured to generate a second clock signal in accordance with the first clock signal and a delay adjust signal;
a retimer configured to sample the hard decision signal in accordance with the first clock signal to generate a retimed signal;
an analog to digital converter configured to sample the soft decision signal in accordance with the second clock signal to generate a sampled signal; and
a relative error circuit configured to generate the delay adjust signal in accordance with the retimed signal and the sampled signal.

25. The system of claim 24 wherein the relative error circuit is configured to generate relative error data in accordance with the retimed signal and the sampled signal.

26. The system of claim 25 wherein the relative error circuit comprises at least one data memory for accumulating the relative error data.

27. The system of claim 24 wherein the analog to digital converter comprises a sample and hold circuit.

28. The system of claim 24 wherein the at least one clock generator comprises a clock and data recovery circuit.

29. The system of claim 24 wherein the at least one clock generator comprises a delay lock loop.

30. The system of claim 29 wherein the delay lock loop comprises at least one variable delay element configured to be controlled in accordance with the delay adjust signal.

31. The system of claim 29 wherein the delay lock loop comprises at least one fixed delay element.

32. The system of claim 24 comprising at least one adaptation loop for adjusting signal quality of the received signal.

33. The system of claim 32 wherein the at least one adaptation loop generates coefficients in accordance with the sampled signal to adjust the signal quality.

34. The system of claim 24 comprising at least one adaptation loop for generating coefficients for the decision feedback equalizer.

35. The system of claim 34 wherein the at least one adaptation loop generates feedback coefficients in accordance with the sampled signal.

36. A method of adjusting clock delay in a system comprising:
temporarily setting a phase delay associated with at least one clock signal to a plurality of delay values;
generating a relative error when the phase delay is temporarily set to each of the delay values;
accumulating the relative error generated for each of the delay values;
identifying at least one delay value associated with a minimum accumulated relative error; and
setting the phase delay in accordance with the identified at least one delay value.

37. The method of claim 36 comprising repeatedly enabling a clock delay adaptation loop to perform the temporarily setting, the generating and the accumulating.

38. The method of claim 37 comprising disabling at least one other adaptation loop when the clock delay adaptation loop is enabled.

39. The method of claim 38 wherein the at least one other adaptation loop adapts based on data sampled in accordance with the at least one clock signal.

40. The method of claim 37 comprising repeatedly disabling the clock delay adaptation loop to enable at least one other adaptation loop.

41. The method of claim 36 wherein:
the at least one clock signal comprises two clock signals; and
generating comprises processing data bits sampled in accordance with each of the two clock signals.

42. The method of claim 41 wherein processing data comprises determining whether a data bit sampled in accordance with a first one of the two clock signals has the same value as a data bit sampled in accordance with a second one of the two clock signals.

43. The method of claim 36 wherein accumulating comprises separately accumulating relative error for each of the delay values.

44. The method of claim 43 wherein identifying comprises comparing the accumulated relative error for each of the delay values to identify at least one delay value associated with the minimum accumulated relative error.

* * * * *